United States Patent
Morimoto et al.

(10) Patent No.: US 7,701,990 B2
(45) Date of Patent: Apr. 20, 2010

(54) LASER DIODE PUMPED SOLID-STATE LASER OSCILLATOR AND LASER DIODE CONTROL METHOD OF THE OSCILLATOR

(75) Inventors: Takeshi Morimoto, Tokyo (JP); Toshiki Koshimae, Tokyo (JP); Toshiaki Watanabe, Tokyo (JP); Akihiro Suzuki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 877 days.

(21) Appl. No.: 10/587,306

(22) PCT Filed: Dec. 8, 2004

(86) PCT No.: PCT/JP2004/018291

§ 371 (c)(1),
(2), (4) Date: Jul. 26, 2006

(87) PCT Pub. No.: WO2006/061891

PCT Pub. Date: Jun. 15, 2006

(65) Prior Publication Data

US 2007/0160098 A1    Jul. 12, 2007

(51) Int. Cl.
*H01S 3/00* (2006.01)
(52) U.S. Cl. ............... 372/38.06; 372/38.02; 372/75
(58) Field of Classification Search ........... 372/38.02, 372/38.06, 75
See application file for complete search history.

(56) References Cited

U.S. PATENT DOCUMENTS

2002/0126724 A1 * 9/2002 Tsunekane et al. ............ 372/69

(Continued)

FOREIGN PATENT DOCUMENTS

DE    103 06 312 A1    7/2004

(Continued)

OTHER PUBLICATIONS

German Office Action dated Feb. 2, 2009.

*Primary Examiner*—Minsun Harvey
*Assistant Examiner*—Joshua King
(74) *Attorney, Agent, or Firm*—Sughrue Mion, PLLC

(57) ABSTRACT

Plural LDs 6 are series-connected and pump a solid-state pumping medium 7. Each of bypass circuits 15 is connected in parallel to an associated one of the LDs 6. An operation of driving each of the bypass circuits 15 is controlled by a control circuit 14. A detection circuit 13 is provided corresponding to each of the LDs 6 and detects a short circuit failure and an open failure of each of the LDs 6 according to a voltage developed thereacross or the like. The detection circuit 13 and the control circuit 14 are connected to and are controlled by an LD shortcircuit control circuit 11. In a case where a failure of the LD is detected by the detection circuit 13, the LD shortcircuit control unit 11 determines the position of the failed LD to bypass electric current having flowed through the failed LD. Then, the control circuit 11 sends a signal to a predetermined control circuit 14 to thereby operate a predetermined bypass circuit 15. The LD shortcircuit control unit 11 determines the position of the LD, which is to be turned off, according to the position of the failed LD to improve a pointing deviation in the solid-state medium 7. Then, the control unit 11 sends a signal to the control circuit 14 to turn off this LD. Thus, the control unit 11 causes a predetermined bypass circuit 15 to operate thereby to turn off the predetermined LD.

11 Claims, 12 Drawing Sheets

U.S. PATENT DOCUMENTS

| | | |
|---|---|---|
| 2002/0150139 A1 | 10/2002 | Koshimae et al. |
| 2004/0165629 A1* | 8/2004 | Iwakura .................. 372/38.02 |
| 2006/0194355 A1 | 8/2006 | Eberhard et al. |

FOREIGN PATENT DOCUMENTS

| | | |
|---|---|---|
| JP | 59-103565 A | 6/1984 |
| JP | 59-113768 A | 6/1984 |
| JP | 10-284789 A | 10/1998 |
| JP | 2001-353897 A | 12/2001 |
| JP | 2002-50813 A | 2/2002 |
| JP | 2004-14917 A | 1/2004 |
| JP | 2004014917 A * | 1/2004 |

* cited by examiner

LASER DIODE PUMPED SOLID-STATE LASER OSCILLATOR AND LASER DIODE CONTROL METHOD OF THE OSCILLATOR

TECHNICAL FIELD

The present invention relates to the configuration and the control of a solid-state laser oscillator having the functions of preventing the laser oscillator from stopping due to the failure of a laser diode (hereunder referred to as "LD") and of correcting an output reduction caused by the failure of the LD.

BACKGROUND ART

FIG. 9 is a view illustrating the configuration of an LD-pumped solid-state laser oscillator. As shown in FIG. 9, the solid-state laser oscillator is constituted by one or more cavities 3, each of which is sandwiched by two mirrors that are a partial reflection mirror 1 and a total reflection mirror 4, so that desired laser beams 5 are taken out from the oscillator. FIG. 10 is a schematic view illustrating the cavity. The cavity 3 is configured so that a solid-state pumping medium 7 is pumped by light irradiated from an LD 6 serving as a pumping light source. FIG. 9 shows the laser oscillator having two cavities. Several tens or hundreds of LDs 6 are arranged to be connected in series so that the solid-state pumping medium 7 is uniformly pumped by an output of the laser oscillator or by an output per LD.

Laser power available from one solid-state pumping medium changes in the volume (shown as a hatched part in FIG. 10 and hereunder referred to a "mode volume") 21 of the solid-state pumping medium 7, through which laser light being in a resonant condition can pass, and increases when the mode volume 21 increases. The mode volume 21 increases or decreases when the output of the LD 6 increases or decreases. In a case where a pumping distribution in the solid-state pumping medium 7 is uniform, the mode volume uniformly exists uniformly with respect to the central axis 10 of the solid-state pumping medium 7, as illustrated in FIG. 10. Generally, a laser output from the cavity is nearly proportional to an LD output that is approximately proportional to an LD energizing current. Thus, to obtain a desired laser output, generally, techniques of controlling an LD current are used. A solid-state laser oscillator required to obtain a high output employs a configuration in which a plurality of cavities are arranged between a partial reflection mirror and a total reflection mirror to thereby obtain a laser output that is a sum of outputs of the cavities.

Next, a failure of the LD is described below.

Failure modes of the LD 6 are a shortcircuit failure mode and an open failure mode. In a case where a short circuit failure occurs, the LD 6 does not emit light, so that an unpumped part is generated in the solid-state pumping medium 7. Thus, the mode volume 21 decreases. Consequently, a laser beam output from the laser oscillator decreases. A method of correcting the laser beam output by increasing an LD energizing current and more strongly pumping the entire solid-state pumping medium 7 is employed as a method of making up for a reduction in the laser beam output.

On the other hand, in a case where an open failure of the LD 6 occurs, an electric current path for energizing the LD 6 is interrupted, so that all the LDs 6 including the LDs 6 which do not malfunction are turned off. The solid-state pumping medium is not pumped. The laser oscillator stops. Consequently, no laser beams can be outputted. A configuration, in which the LDs 6 are parallel-connected to one another, is cited as a countermeasure against the stoppage of the oscillator. This configuration needs a power supply capable of supplying electric current, the amount of which is n times ("n" designates the number of LDs) that of electric current required in the case of series-connecting the LDs, and peripheral equipment. Therefore, the structure and the cost of this configuration are impractical. Thus, a method of series-connecting the LDs 6 and providing a bypass circuit in parallel to each of the LDs 6 to thereby form an electric current path at an open failure of the LD 6 has been in common use. Because the bypassed LD 6 is turned off, the laser output is lowered. A method of increasing the LD energizing current and more strongly pumping the entire solid-state pumping medium 7, similarly to the case of the shortcircuit failure, is employed as the method of making up for a reduction in the laser output.

Patent Document 1: JP-A-10-284789

Patent Document 2: JP-A-59-103565

DISCLOSURE OF THE INVENTION

Problems that the Invention is to Solve

In a case where the failure of an LD occurs, a related LD-pumped solid-state laser oscillator corrects a reduction in a laser output, which is caused by the turn-off of the LD, by increasing an energizing current supplied to each of the other normal LDs. However, the laser output cannot be restored by simply allotting an amount of electric power, which has been consumed by the failed LD, to the other normal LDs, that is, simply restoring a total amount of electric power to an amount of electric power used before the failure occurs. Reasons are described below.

When the LD output is uneven due to the failure of the LD, so that the solid-state pumping medium is not uniformly pumped, a laser beam is deflected in the solid-state pumping medium. Thus, what is called a pointing deviation is caused. Reasons for deterioration of the pumping efficiency at occurrence of the pointing deviation are described below.

FIG. 11(a) shows the mode volume in a case where one of the LD is turned off and where the solid-state pumping medium is not uniformly pumped. When the one of the LDs 20 is turned off, a laser beam 5 is deflected to a part, which is strongly pumped in the solid-state pumping medium, as illustrated in FIG. 11(a). Consequently, what is called a pointing deviation is caused. In this case, the mode volume 21 cannot uniformly be distributed with respect to the central axis 10 of the solid-state pumping medium 7. Usually, the mode volume 21 cannot be present outside the solid-state pumping medium 7. Therefore, in a case where the output of the LD 6 is increased, the mode volume 21 does not have a shape illustrated in FIG. 11(b). Instead, the mode volume 21 has a shape illustrated in FIG. 11(a) so that the mode volume 21 is contained in the solid-state pumping medium 7. Thus, the laser output is decreased by an amount corresponding to a part of the mode volume 21, which protrudes from the solid-state pumping medium 7 as shown in FIG. 11(b). Consequently, the pumping efficiency is degraded. Therefore, it is insufficient for obtaining an original laser output, that is, the original mode volume 21 to supply the total amount of electric power supplied before the failure occurs. There is the necessity for supplying electric power, whose amount is more than the total amount of electric power supplied before the failure occurs.

FIG. 12 illustrates a case where plural cavities are arranged in series in the solid-state laser oscillator so as to obtain a high output. When an LD 20 is turned off in one cavity, the mode volume 21 in this cavity is similar to that shown in FIG. 11(a), as illustrated in FIG. 12. However, in the other cavity, an incident laser beam deviates from the central axis of the solid-state pumping medium. Thus, similarly to the cavity in which the LD 20 is turned off, a pointing deviation is caused, as illustrated in FIG. 12. In this case, the mode volume 21 has a shape adapted so that no part of the mode volume 21 protrudes from the solid-state pumping medium 7, that the mode volume 21 is decreased, similarly to the mode volume 21 in the cavity in which the LD 20 is turned off, and that the pumping efficiency is lowered. The degree of lowering the pumping efficiency in this case is substantially equal to that of lowering the pumping efficiency in the case of the cavity in which the LD is turned off.

Thus, as described above, when the failure of the LD occurs, the LD is turned off, and the pumping distribution is uneven. Even when the amount of the output of the turned-off LD is allotted to the outputs of the normal LDs, that is, the total amount of electric power is restored to the same level as that of the electric power used before the failure occurs, the original level of the laser output cannot be obtained. That is, the pumping efficiency of the cavity is lowered. Consequently, the normal LDs should share an amount of the output of the turned-off LD. In a case where plural cavities are connected to one another, pointing deviations occur in all the cavities. Thus, the pumping efficiency is lowered even in the cavity whose LDs are normal. Therefore, even the cavity, in which all the LDs are normal, should increase outputs of the LDs to obtain the original laser output.

Meanwhile, it is known that when the energizing current for an LD increases, the lifetime of the LD decreases, as shown in FIG. 13. Thus, the energizing current for the LD should be reduced as much as possible. However, as described above, the reduction in the pumping efficiency due to the turn-off of the LD results in that a laser output, whose amount is larger than that of the turned-off LD, should be allotted to the other normal LDs to recover the original laser output. This causes problems that the LD energizing current is increased very much, and that the lifetime of each of the LDs is shortened. An example of the technique of configuring a bypass circuit without increasing the energizing current is the technique of providing a bypass circuit, which has a spare LD, in parallel to each of the LDs, as described in Patent Document 3. However, LDs are very costly, so that this related technique has a cost problem. Especially, in the case of a high-output laser oscillator, the number of necessary LDs is large. Also, it is difficult due to structural constraints to additionally provide the spare LD in the bypass circuit. Therefore, the oscillator cannot help increasing the energizing current for each of the LDs at occurrence of the failure of the LD to make up for the reduction in the laser output. Consequently, it is necessary to reduce this increase as much as possible.

Patent Document 3: JP-A-59-113768

The invention is accomplished to solve the aforementioned problems. Accordingly, an object of the invention is to obtain an LD-pumped solid-state laser oscillator enabled to suppress, even in a case where a failure of an LD occurs and where a reduction in pumping efficiency is caused due to a pointing deviation, an increase in energizing current supplied to an LD, which is needed to recover a laser output.

Means for Solving the Problems

According to the invention, there is provided an LD-pumped solid-state laser oscillator that comprises a solid-state pumping medium, a plurality of laser diodes placed around the solid-state pumping medium and adapted to irradiate pumping light to the solid-state pumping medium, detection means adapted to detect a failure of the laser diode, and control means adapted to determine a position of the laser diode, whose failure is detected by the detection means, and to control supply currents, which are supplied to other normal laser diodes, according to the position of the laser diode whose failure occurs.

ADVANTAGES OF THE INVENTION

The invention can suppress an increase in the energizing current for each of LDs, which are used to obtain a predetermined laser output, by adjusting, according to the position of an LD of which a failure occurs, outputs of other normal LDs to thereby correct the unevenness of the pumping distribution in the solid-state pumping medium.

BEST MODE FOR CARRYING OUT THE INVENTION

First Embodiment

Figure 1:
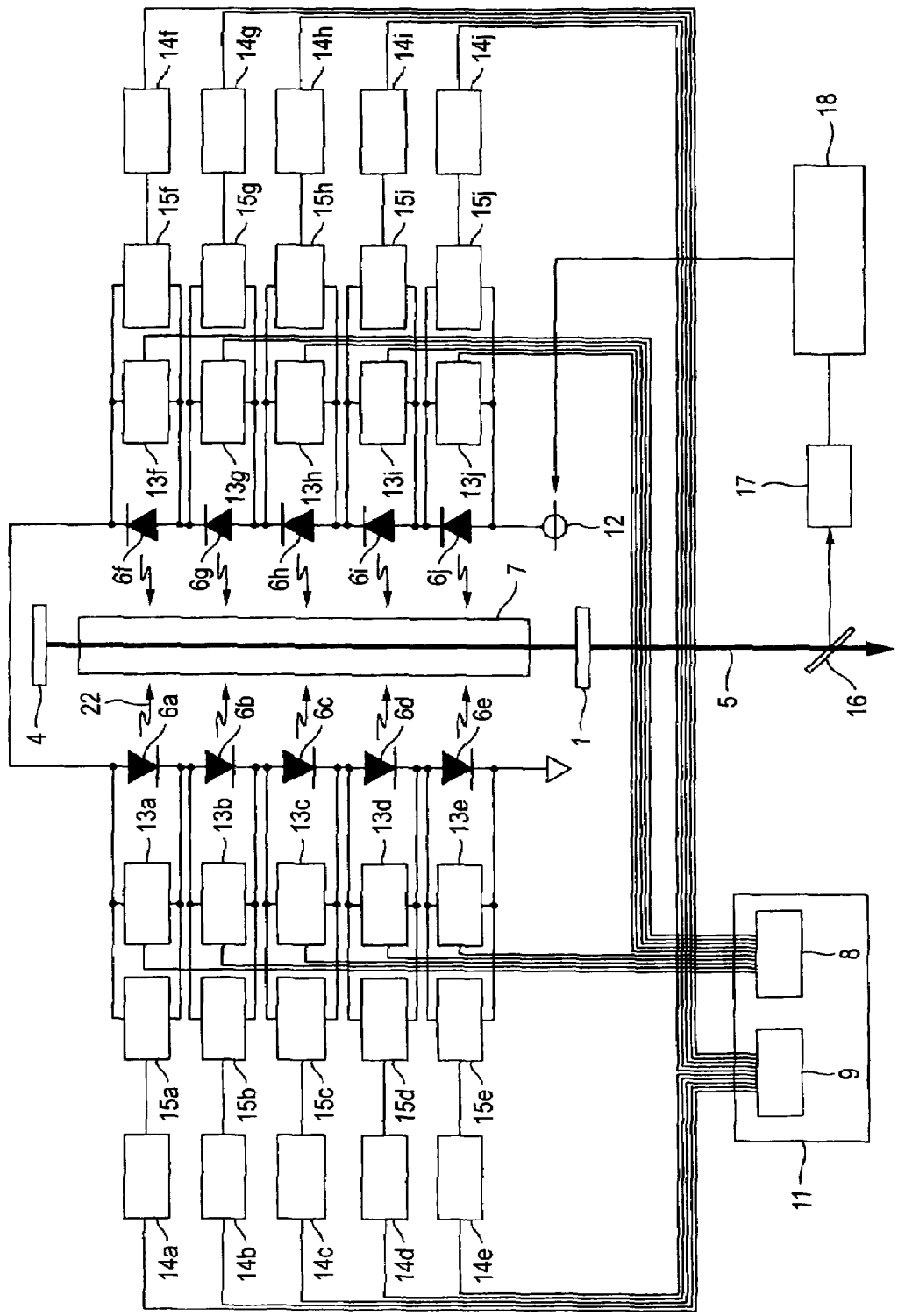
FIG. 1 is a view illustrating the configuration of an LD-pumped solid-state laser oscillator that is a first embodiment of the invention.

Hereinafter, an embodiment of the invention is described with reference to the accompanying drawings. FIG. 1 is a view illustrating the configuration of an LD-pumped solid-state laser oscillator serving as an embodiment of the invention, which is provided with an LD short-circuit control unit. The laser oscillator, in which the solid-state pumping medium is pumped in one cavity by a total of 10 LDs from two directions respectively corresponding to two sets of 5 LDs, is illustrated in this figure. As shown in FIG. 1, LDs 6a to 6j are series-connected and emit light in response to a direct electric current outputted by a power supply unit 12, so that pumping light 22 pumps the solid-state pumping medium 7. Each of bypass circuits 15a to 15j is connected in parallel to an associated one of the LDs 6a to 6j. An operation of driving each of the bypass circuits 15a to 15j is controlled by an associated one of control circuits 14a to 14j. Each of detection circuits 13a to 13j is connected in parallel to an associated one of the LDs 6a to 6j, and detects a shortcircuit failure and an open failure of the associated LD according to a voltage developed across the associated LD. Each of the detection circuits may use a method described in, for example, Patent Document 4. The detection circuits 13a to 13j and the control circuits 14a to 14j are connected to the LD shortcircuit control unit 11 and exchange detection signals and control signals. An LD power control unit 18 controls ON/OFF and a laser output of the oscillator.

Patent Document 4: Japanese Patent Application No. 2003-363040

In the foregoing description, the configuration of the oscillator employing the detection circuit adapted to detect a shortcircuit failure or an open failure of an LD according to a voltage developed across the LD has been described. However, the detection circuit using a photodiode, which is described in, for instance, the Patent Document 1, may be employed. Alternatively, an optical thyristor described in the Patent Document 2 may be employed. As long as the detection circuit is means for detecting a shortcircuit failure and an open failure of an LD, the configuration of the oscillator is not limited to these configurations.

The LD shortcircuit control unit 11 is provided with a determination portion 8 and a control portion 9. The determination portion 8 receives a detection signal indicating that the detection circuit 13 detects an occurrence of a failure of an LD. Then, the determination portion 8 determines which of the LDs is faulty. Also, the determination portion 8 determines which of the LDs is short-circuited next to correct the unevenness of the pumping distribution in the solid-state pumping medium. Subsequently, the determination portion 8 sends position information representing the position of each of such LDs to the control portion 9. The control portion 9 sends control signals to the control circuit 14 corresponding to each of the bypass circuits 15 to be driven according to the position information sent from the determination portion 8 so as to drive the bypass circuit 15 corresponding to the failed LD and the bypass circuit 15 corresponding to the LD to be short-circuited next.

The output of laser beams is controlled as follows. A half mirror 16 is disposed on an optical path of a laser beam 5 goes out from the partial reflection mirror 1. A part of the laser beams 5 reflected by the half mirror 16 is received by a power sensor 17 to thereby measure an output. A detection value obtained by the power sensor 17 is sent to an LD power control unit 18. Then, the LD power control unit 18 compares an actual output value of the laser beam 5, which is calculated from this detection value, and a desired laser beam output value. Subsequently, the LD power control unit 18 controls the power supply 12 to adjust electric power supplied to the LD so that the actual output value becomes equal to the desired output value.

Figure 2:
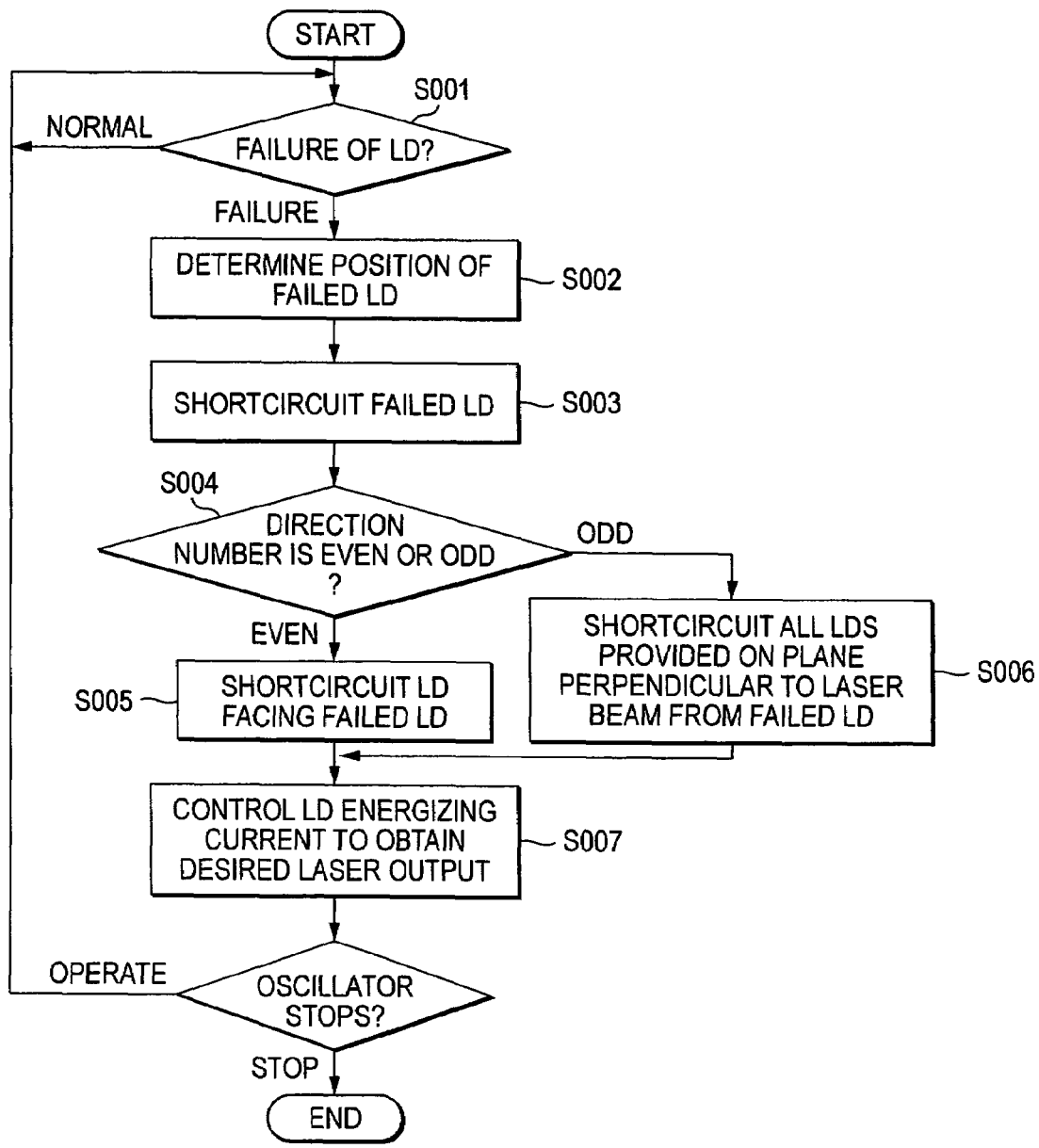
FIG. 2 is a flowchart illustrating a process of controlling the short-circuiting of an LD of the LD-pumped solid-state laser oscillator that is the first embodiment of the invention.

Next, an operation of the oscillator is described below by using to a flowchart shown in FIG. 2 and also referring to symbols shown in FIG. 1.

During the oscillator operates, the voltage developed across each of the LDs 6 is always monitored in step S0001 by the detection circuit 13 to thereby observe whether a failure of each of the LDs occurs.

It is now supposed that a failure of an LD 6a occurs in the embodiment of FIG. 1.

When the detection circuit 13a detects an open failure or a shortcircuit failure of the LD 6a, a detection signal is sent therefrom to the determination portion 8 of the LD shortcircuit control unit 11.

The determination portion 8 determines the position of the failed LD 6a and then transfers position information representing the position of the failed LD 6a to the control portion 9 in step S002.

The control portion 9 sends a shortcircuit signal to the control circuit 14a according to the received position information representing the position of the failed LD 6a to bypass electric current outputted from the LD 6a.

When receiving the shortcircuit signal, the control circuit 14a causes the bypass circuit 15a thereby to shortcircuit the LD 6a. Consequently, in step S003, electric current flows in the bypass circuit 15a, while the other LDs 6b to 6j keep emitting light, without being turned off.

Subsequently, in step S004, the determination portion 8 determines whether a direction number is even or odd.

Figure 3:
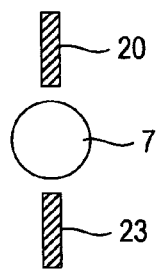
FIGS. 3(a) to 3(e) are explanatory views illustrating a direction number in the case of an ordinary LD-pumped solid-state laser oscillator.
Figure 3:
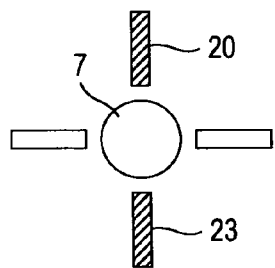
Figure 3:
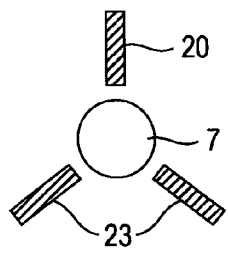
Figure 3:
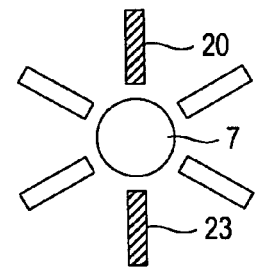
Figure 3:
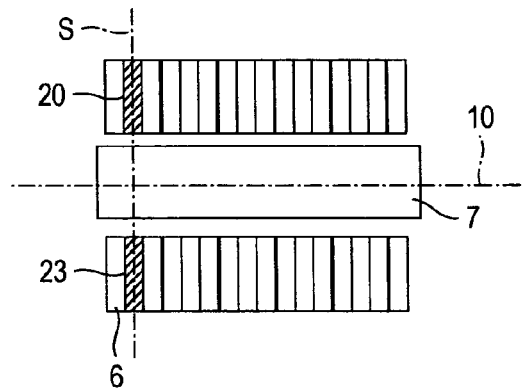

Incidentally, the direction number is a numerical value indicating the number of directions from which pumping light is irradiated onto the solid-state pumping medium 7 by the LDs 6. FIGS. 3(a) to 3(d) are views illustrating a cavity, which are taken from a direction of a laser beam axis. FIG. 3(a) shows a case in which the pumping light rays are irradiated from two directions. Thus, the direction number is 2. Similarly, FIG. 3(b) shows a case where the direction number is 3. FIG. 3(c) shows a case where the direction number is 4, while FIG. 3(d) shows a case where the direction number is 6. Because great importance is placed on the symmetry of the pumping distribution, the LDs 6 are disposed around the solid-state pumping medium 7 at regular angular intervals, as illustrated in FIG. 3.

In the case illustrated in FIG. 1, the direction number is 2, so that the determination portion 8 determines that the direction number is even.

The determination portion 8 selects the LD, which is to be short-circuited next, according to the position information representing the position of the failed LD6a.

FIG. 3(e) is a view illustrating the cavity, which is taken from a lateral direction. To correct the pointing deviation, it is advisable to turn off the LD 23 provided on the same plane S perpendicular to the central axis 10 of the solid-state pumping medium, which faces the failed LD 20.

In a case where the direction number is even, the failed LD 20 and the LD 23 provided on the same plane perpendicular to the central axis 10 of the solid-state pumping medium and at the position facing the LD 20 are turned off. For example, in a case where the direction number is 2, 4, or 6, the failed LD 20 and the LD 23 shown in FIGS. 3(a), 3(b), and 3(d) as shaded columns, and provided on the same plane perpendicular to the central axis 10 of the solid-state pumping medium, are controlled to be turned off. (S005)

In a case where the direction number is odd, all of the failed LD 20 and the LD 23 provided on the same plane perpendicular to the central axis 10 of the solid-state pumping medium are turned off. For instance, in a case where the direction number is 3, the failed LD 20 and the LD 23 shown in FIG.

3(b), as shaded columns, and provided on the same plane perpendicular to the central axis 10 of the solid-state pumping medium, are controlled to be turned off. (S006)

In the case shown in FIG. 1, the LD 6f is an LD to be short-circuited. Thus, the determination portion 8 transfers the position information representing the position of the LD 6f to the control portion 9.

The control portion 9 sends a shortcircuit signal to the control circuit 14f according to the received position information representing the position of the failed LD 6f to bypass electric current outputted from the LD 6f.

When receiving the shortcircuit signal, the control circuit 14f causes the bypass circuit 15f thereby to shortcircuit the LD 6f. Consequently, the LD 6f is turned off because the current value of an electric current flowing therein does not reach a threshold current, while the other LDs 6b to 6e and LDs 6g to 6j keep emitting light.

The LD power control unit 18 controls the power supply 12 and adjusts the LD energizing current while a value measured by the power sensor 17 is fed back to restore the laser output, which is lowered due to the turn-off of the LD, to a desired laser output. (S007)

Then, the process consisting of the steps S001 to S007 is iteratively performed until the oscillator stops.

In a case where it is determined in the step S005 that the direction number is even, the LD facing the turned-off LD is turned off. However, similarly to the case where the direction number is odd, the pointing deviation can be corrected even when all of the LDs, which include the LD facing the turned-off LD and are provided on the same plane perpendicular to the central axis of the solid-state pumping medium, are turned off. However, in this case, when the direction number is 4 as shown in FIG. 3(c), four LDs including the failed LD are turned off. Thus, when the laser output is restored, the laser output to be shared by each of the other normal LDs increases. In the case where the direction number is even, the pointing deviation can be corrected by turning off only the LD facing the failed LD. Thus, it is desirable to perform processing, similarly to the step S005.

Figure 4:
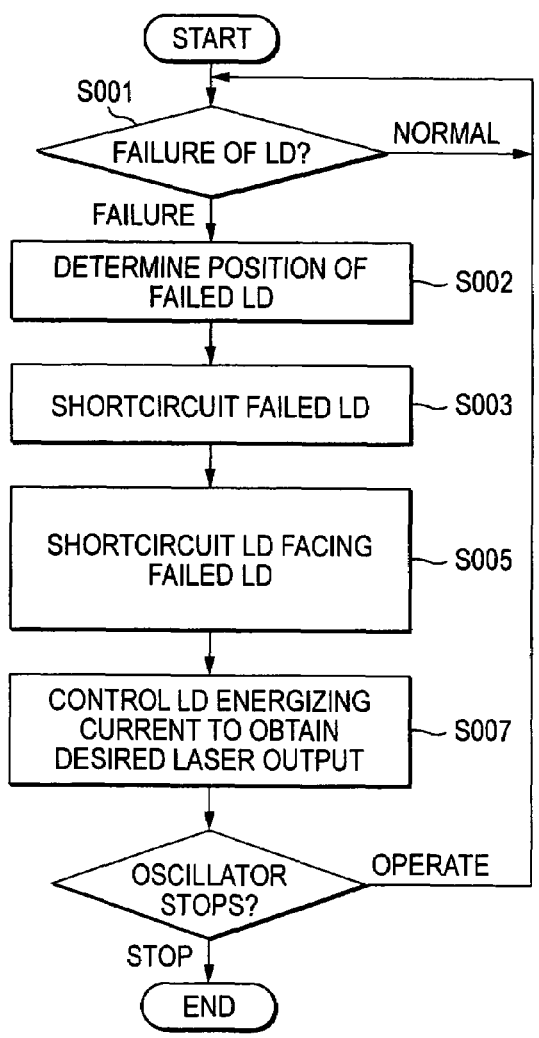
FIGS. 4(a) and 4(b) are flowcharts illustrating another process of controlling the short-circuiting of the LD of the LD-pumped solid-state laser oscillator that is the first embodiment of the invention.
Figure 4:
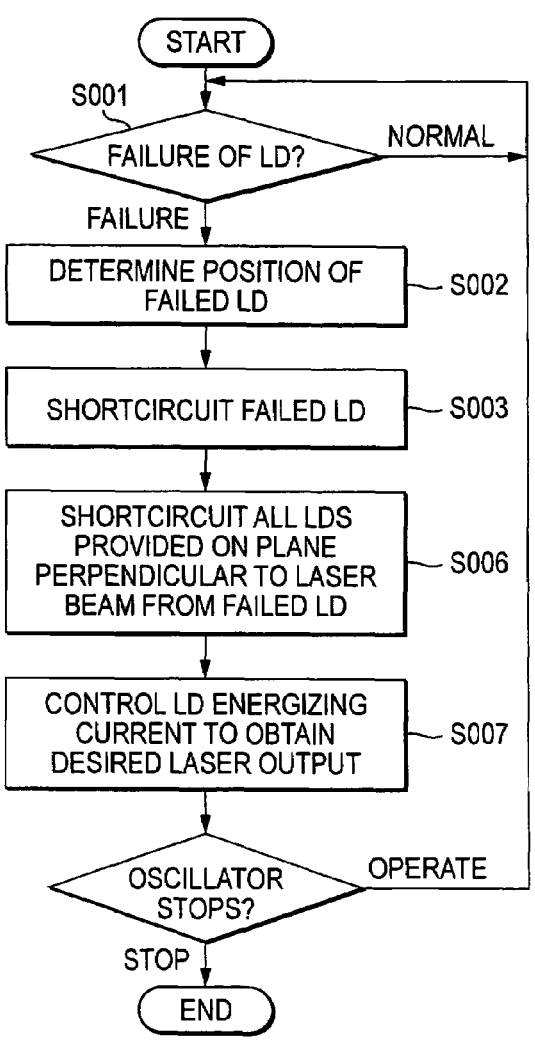

Meanwhile, as described in the foregoing description of the operation, the direction number is determined by the determination portion 8. However, usually, the direction number is predetermined as a design value of each of the laser oscillators. Thus, the determination portion 8 may be designed to be adapted to the oscillator, in which the determination portion is provided, thereby to perform processing corresponding to a fixed even direction number or a fixed odd direction number. For example, in a case where the laser oscillator is designed so that the direction number is even, steps S004 and S006 may be omitted, as illustrated in FIG. 4(a). In a case where the laser oscillator is designed so that the direction number is odd, steps S004 and S005 may be omitted, as illustrated in FIG. 4(b).

Figure 5:
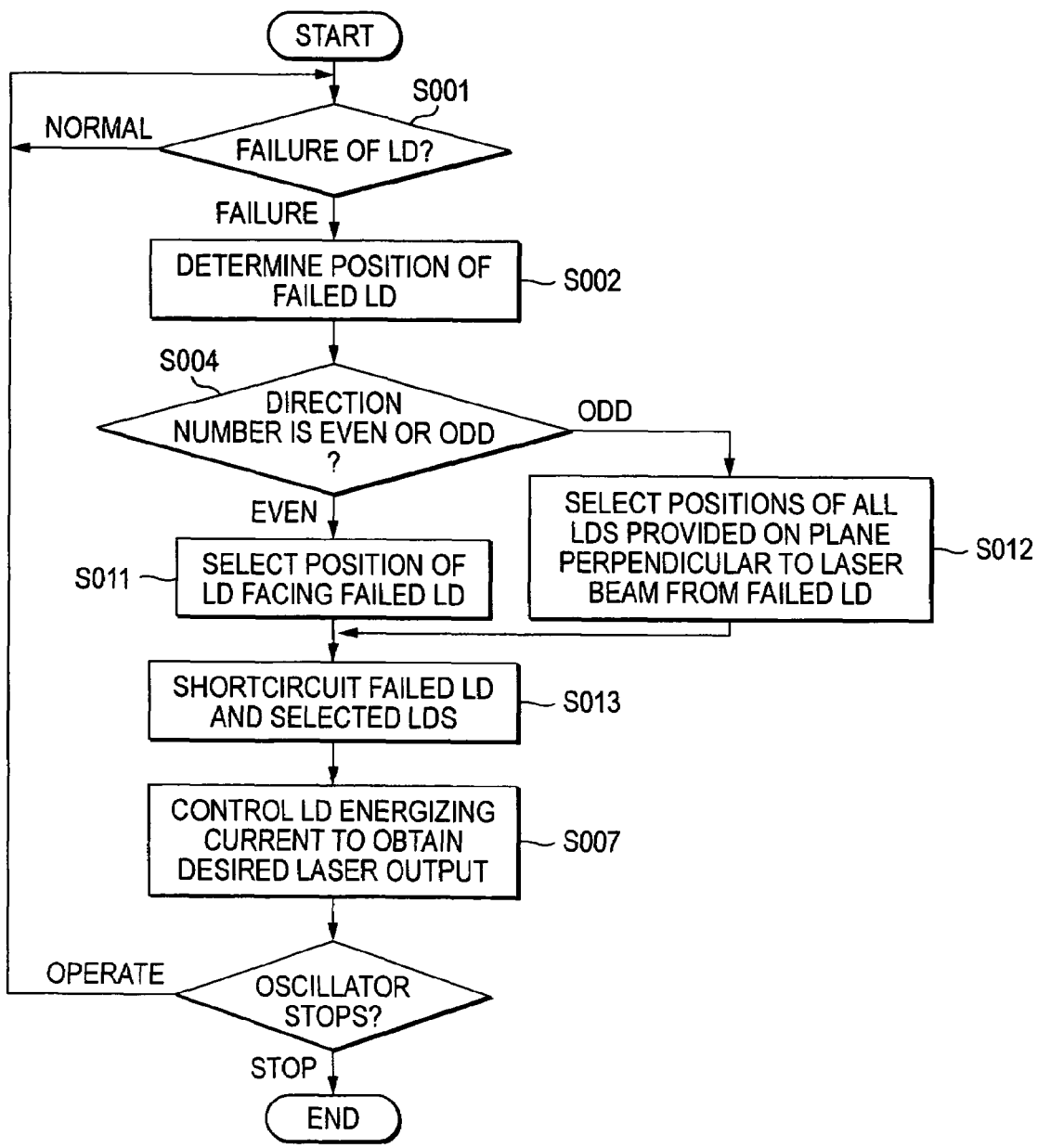
FIG. 5 is a flowchart illustrating a still another process of controlling the short-circuiting of the LD of the LD-pumped solid-state laser oscillator that is the first embodiment of the invention.

Also, as described in the foregoing description of the operation, after the LD turned-off due to the failure is short-circuited, the LD to be turned off next is selected. Further, this LD is short-circuited. However, as described below, the oscillator may be configured so that the positions of the failed LD and the LD to be turned off next are first determined, that thereafter, signals may be sent to the control circuits so that the failed LD and the LD to be turned off next are short-circuited. An operation flow in this case is described below by referring to FIG. 5. In FIG. 5, a step, in which an operation similar to that performed in the step illustrated in FIG. 2, is designated by the same step number.

During the oscillator operates, the voltage developed across each of the LDs 6 is always monitored by the detection circuit 13 to thereby observe whether a failure of each of the LDs occurs. (S001)

It is now supposed that a failure of an LD 6a occurs in FIG. 1.

When the detection circuit 13a detects an open failure or a shortcircuit failure of the LD 6a, a detection signal is sent therefrom to the determination portion 8 of the LD shortcircuit control unit 11.

The determination portion 8 determines the position of the failed LD 6a. (S002)

Subsequently, the determination portion 8 determines whether a direction number is even or odd. (S004)

In the case illustrated in FIG. 1, the direction number is 2, so that the determination portion 8 determines that the direction number is even.

The determination portion 8 selects the LD, which is to be short-circuited next, according to the position information representing the position of the failed LD6a.

In a case where the direction number is even, the LD 23 provided at a position facing the failed LD 22. (S011)

In a case where the direction number is odd, all of the failed LD 20 and the LD 23 provided on the same plane perpendicular to the central axis 10 of the solid-state pumping medium and at the position facing the LD 20 are turned off. (S012)

In the case shown in FIG. 1, the LD 6f is an LD to be short-circuited.

Then, the determination portion 8 transfers the position information representing the position of the LD 6a and the LD 6f to the control portion 9.

The control portion 9 sends shortcircuit signals to the control circuits 14a and 14f, respectively, according to the received position information representing the positions of the failed LD 6a and the LD 6f, which is to be turned off, to bypass electric currents outputted from the LD 6a and the LD 6f.

When receiving the shortcircuit signals, the control circuit 14a causes the bypass circuit 15a thereby to shortcircuit the LD 6a. Also, when receiving the shortcircuit signals, the control circuit 14f causes the bypass circuit 15f thereby to shortcircuit the LD 6f. Consequently, electric currents flow through the bypass circuits 15a and 15f. Thus, the LD 6f is turned off because the current value of an electric current flowing therein does not reach a threshold current, while the other LDs 6b to 6e and LDs 6g to 6j keep emitting light. (S013)

The LD power control unit 18 controls the power supply 12 and adjusts the LD energizing current in step S007 while a value measured by the power sensor 17 is fed back to restore the laser output, which is lowered due to the turn-off of the LD, to a desired laser output.

Then, the process consisting of the steps S001 to S007 is iteratively performed until the oscillator stops.

In the foregoing description of the operation, it has been described that the bypass circuit is operated even when a shortcircuit failure of the LD occurs. Usually, in a case where a shortcircuit failure of the LD occurs, electric current keeps flowing therethrough. Thus, this failure has no effect on the other normal LDs. Therefore, it is not always necessary to operate the bypass circuit. However, there are fears that a solder part of the LD, the shortcircuit failure of which occurs, is abnormally overheated, and that solder is scattered therefrom. Consequently, it is desirable to cause the bypass circuit to operate thereby to reduce an amount of electric current flowing through the failed LD.

Next, it is described in detail below with an example, which is an oscillator constituted by one cavity, that an increase in the energizing current for the LDs can be suppressed by the aforementioned operation.

Figure 6:
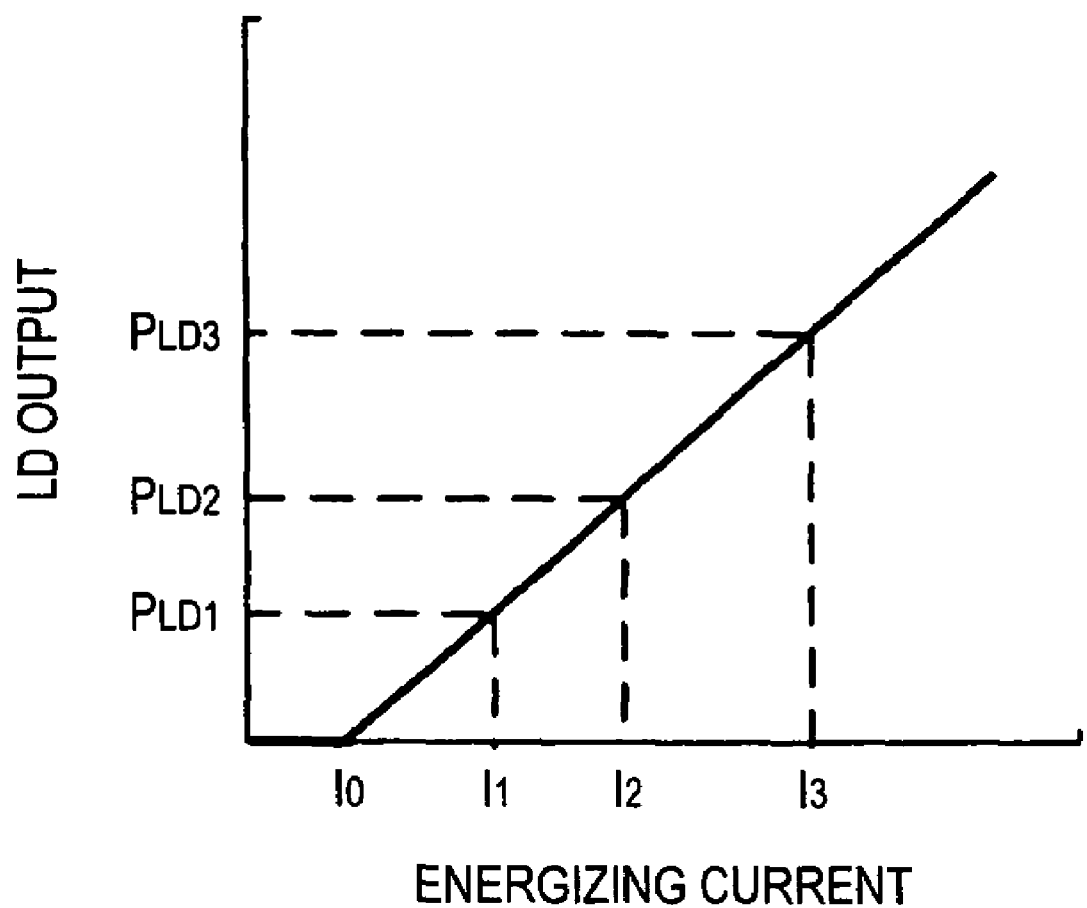
FIG. 6 is a graph illustrating the relation between the energizing current for the LD of the ordinary LD-pumped solid-state laser oscillator and the pumping light output from the LD.

First, the relation between the energizing current for the LD and the laser beam output is described by referring to FIG. 6. FIG. 6 is a graph illustrating the relation between the energizing current for the LD and the output from the LD. When the energizing current reaches a threshold current $I_0$, the LD starts outputting light. The output of the LD increases in proportion to the energizing current. Let $P_{LD}$ denote an LD output with respect to an electric current I. Thus, the following equation holds.

$$P_{LD} = \alpha(I - I_0) \quad (1)$$

where $\alpha$ is a ratio of the LD output to the energizing current.

Figure 7:
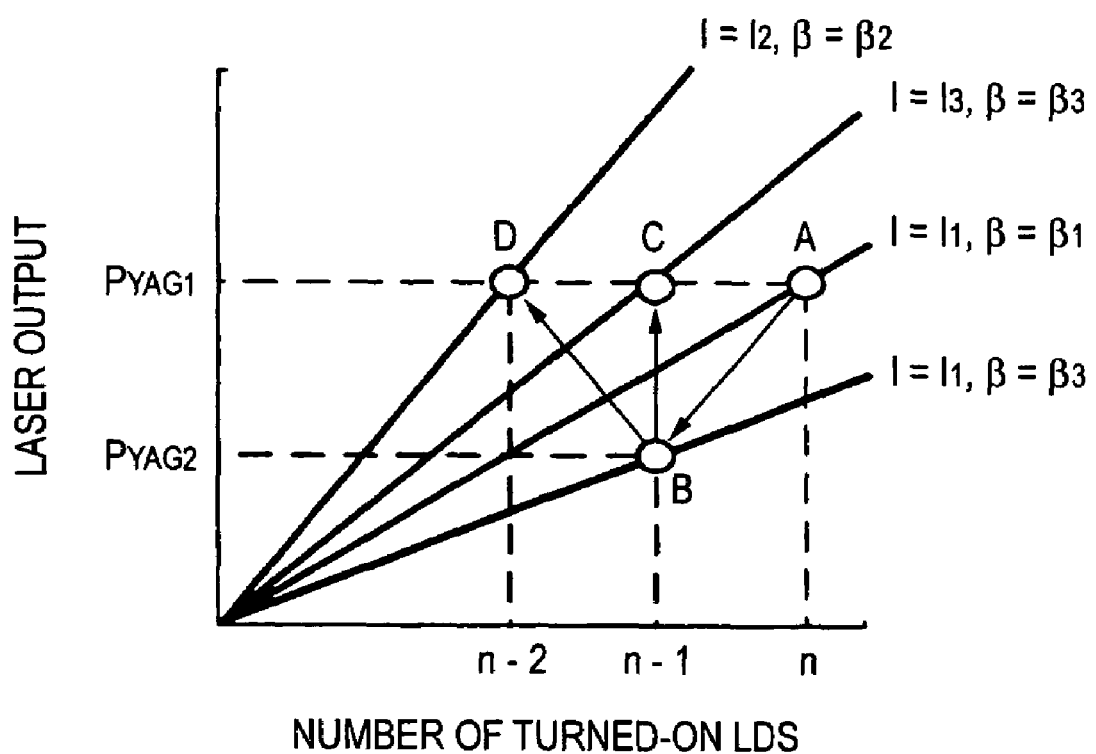
FIG. 7 is a graph illustrating the relation between the number of turned-on LDs of the LD-pumped laser oscillator, which is the first embodiment of the invention, and the laser output of the oscillator.

FIG. 7 is a graph illustrating the relation between the number of turned-on LDs and the laser output of the oscillator. Let "n" designate the number of the LDs that are presently turned on. Thus, the laser output $P_{YAG}$ is given by the following equation.

$$P_{YAG} = \beta(n \cdot P_{LD}) \quad (2)$$

where $\beta$ is a coefficient representing the pumping efficiency.

First, in a case where no failure of the LD occurs (see a point A shown in FIG. 7), where the LD energizing current $I = I_1$, and where $P_{YAG}$ denotes the laser output, the following equation is derived from the equations (1) and (2).

$$P_{YAG_1} = \beta_1(n \cdot P_{LD1}) \quad (3)$$
$$= \beta_1(n \cdot \alpha(I_1 - I_0))$$

Next, in a case where a failure of the LD occurs (see a point B shown in FIG. 7), the detection circuit detects the failure of the LD to thereby drive the LD bypass circuit. The number of pumping light sources decreases. Reduction in the pumping efficiency ($\beta_1 \rightarrow \beta_3$) occurs due to the pointing deviation. The laser output is reduced to $P_{YAG2}$. Thus, $P_{YAG2}$ is given by the following equation derived from the equations (1) and (2).

$$P_{YAG2} = \beta_3\{(n-1) \cdot P_{LD1}\} \quad (4)$$
$$= \beta_3\{(n-1) \cdot \alpha(I_1 - I_0)\}$$

The LD power control unit instructs the power supply to increase the energizing current (see a point C shown in FIG. 7) so that the laser output $P_{YAG2}$ follows an instruction value $P_{YAG1}$. Let $P_{LD3}$ designate an LD output at an instruction current value $I_3$. Thus, the following equations are derived from the equations (3) and (4).

$$\beta_3\{(n-1) \cdot P_{LD3}\} = P_{YAG1} \quad (5)$$
$$\beta_3\{(n-1) \cdot \alpha(I_3 - I_0)\} = \beta_1\{n \cdot \alpha(I_1 - I_0)\}$$
$$I_3 = \frac{n}{n-1} \cdot \frac{\beta_1}{\beta_3} \cdot (I_1 - I_0) + I_0$$

Incidentally, the second term of the right side of the equation representing the value of the instruction current $I_3$ is constant. The first term $$\left(\frac{n}{n-1}\right)$$

of the right side can be approximated to be $$\left(\frac{n}{n-1} \approx 1\right)$$

in a case where the number of the turned-on LDs, which is obtained before the failure occurs, ranges from several tens to several hundreds and is sufficiently large. Thus, the term $$\frac{\beta_1}{\beta_3},$$

which is in inverse proportion to the pumping efficiency, of the instruction current $I_3$ is dominant. This attracts attention according to the invention. Each normal LD is turned off by driving the bypass circuit provided in parallel to the normal LD so that uniform pumping balance is achieved. Consequently, an increase in the LD energizing current, which is to be caused to obtain the original laser output, is suppressed. Also, the reduction in the lifetime of the LD is suppressed.

As described above, when one LD is turned off, unevenness of the pumping distribution of the solid-state pumping medium is caused, so that a pointing deviation occurs. Thus, the pumping efficiency is lowered. The technique of solving this problem is described below with an example of a cavity adapted to pump the solid-state pumping medium by LDs from two symmetric directions.

Figure 8:
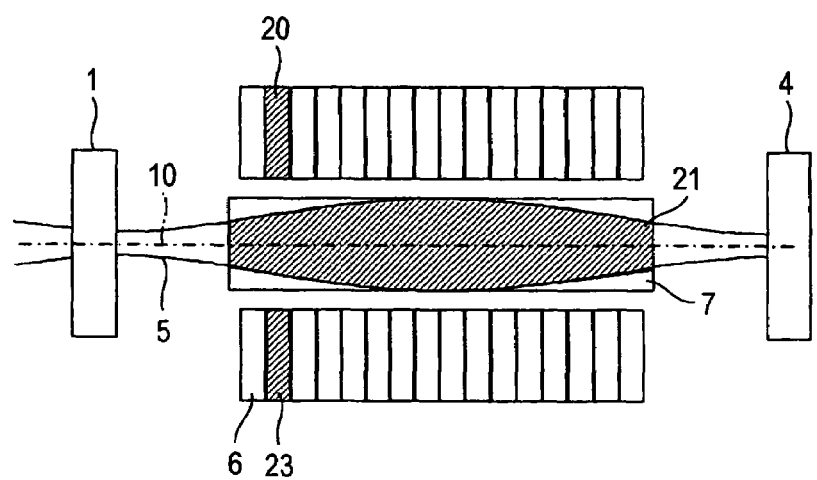
FIG. 8 is an explanatory view illustrating the improvement of a pointing deviation in a solid-state pumping medium in the first embodiment of the invention.
Figure 9:
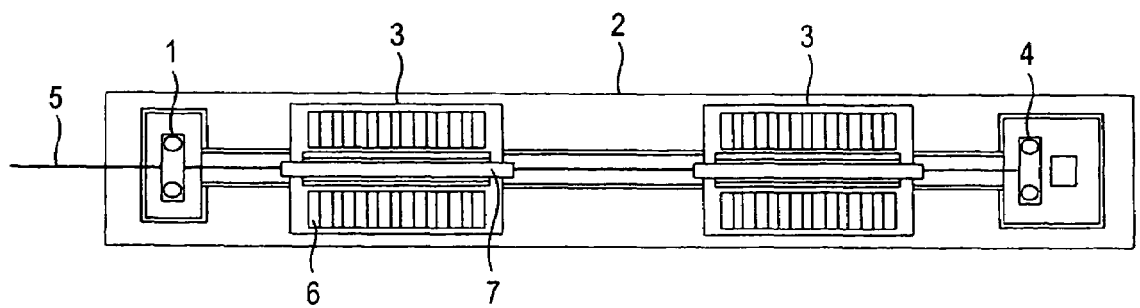
FIG. 9 is a schematic view illustrating the configuration of an ordinary LD-pumped solid-state laser oscillator.
Figure 10:
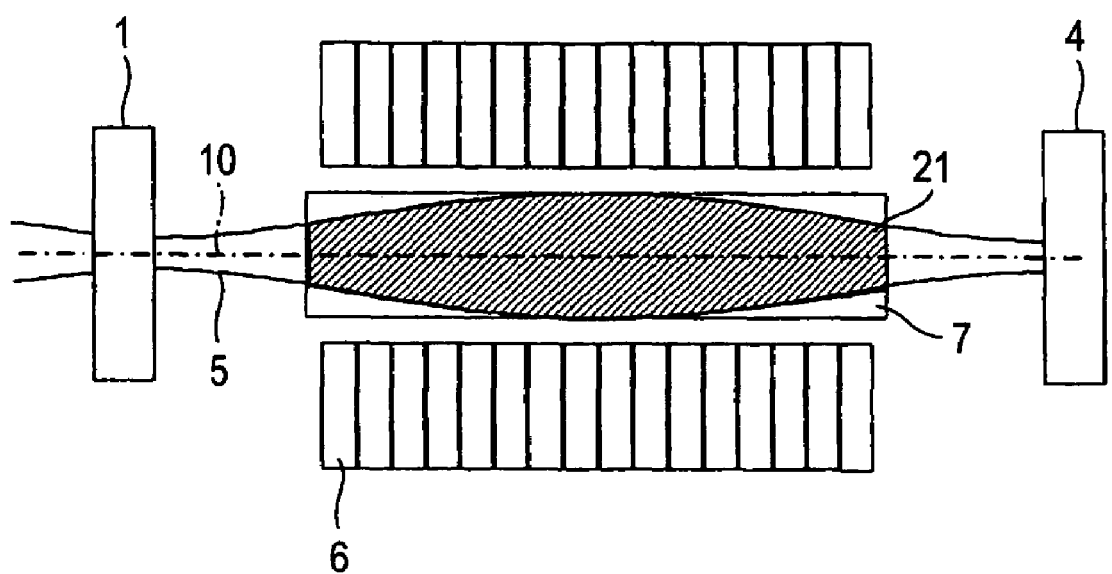
FIG. 10 is a schematic view illustrating a cavity of the ordinary LD-pumped solid-state laser oscillator.
Figure 11:
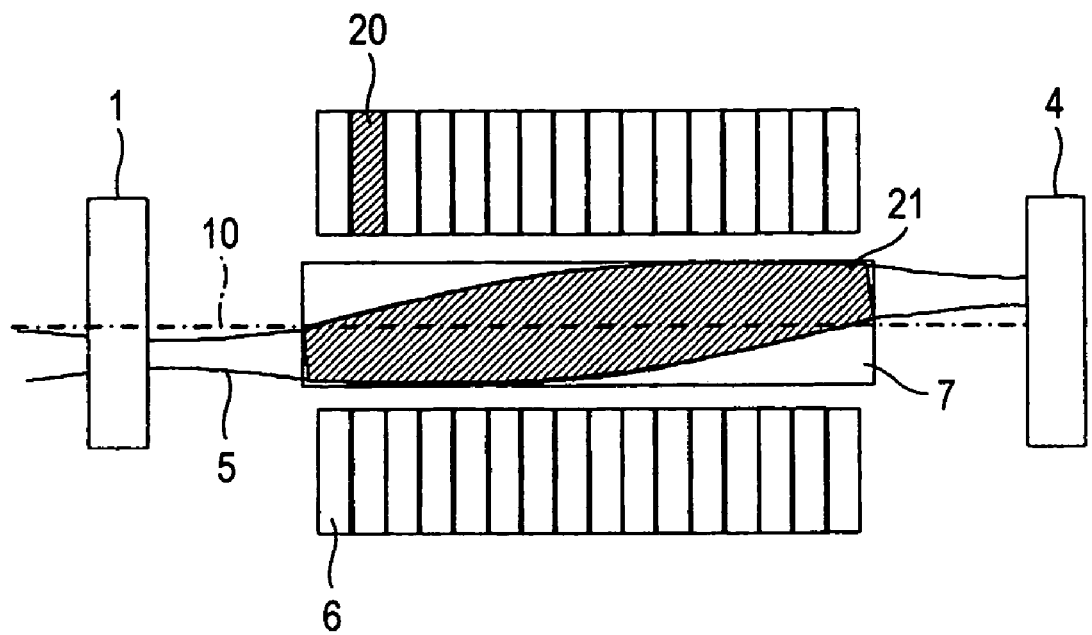
FIGS. 11(a) and 11(b) are explanatory views illustrating a pointing deviation in a solid-state pumping medium.
Figure 11:
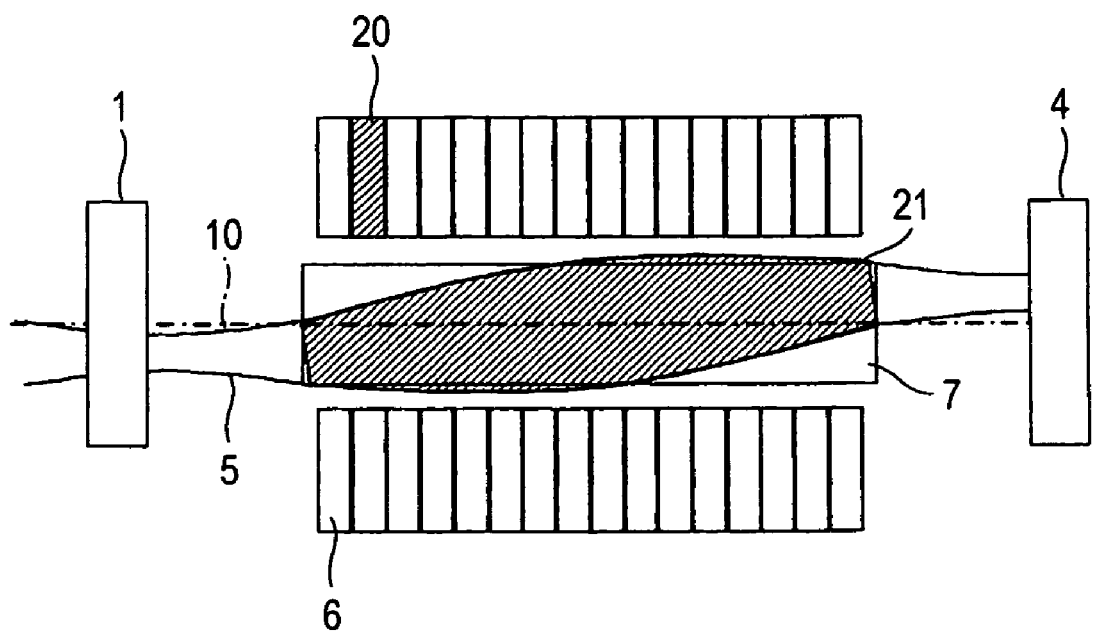
Figure 12:
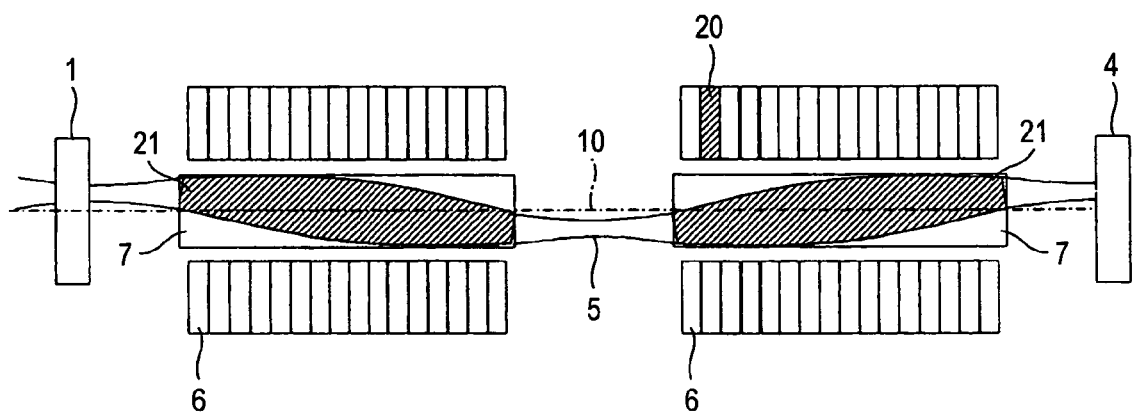
FIG. 12 is an explanatory views illustrating a pointing deviation in a solid-state pumping medium in a case where two cavities are connected to each other.
Figure 13:
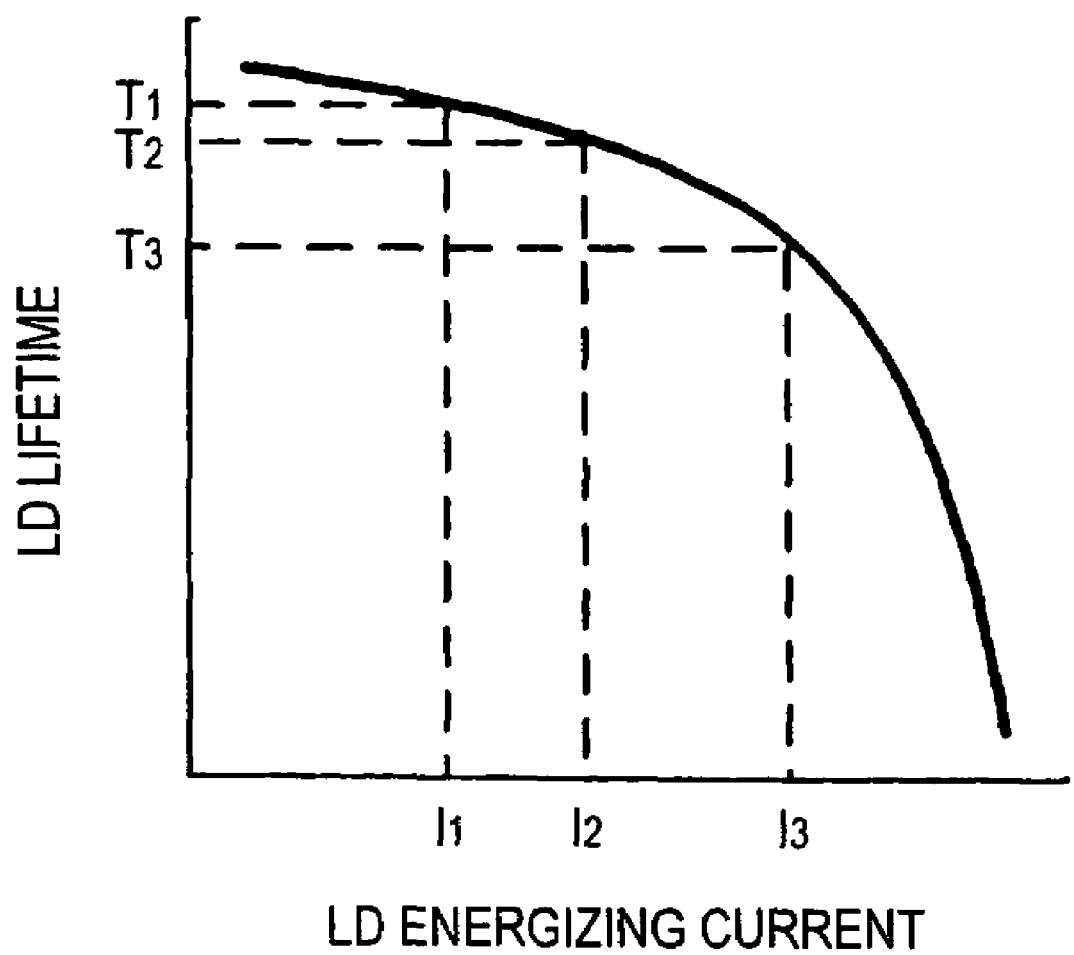
FIG. 13 is a graph illustrating the correlation between the energizing current and the lifetime of an LD.

When the LD is faulty and is turned off, the unevenness of the pumping distribution occurs. As described above, a laser beam is deflected to a part strongly pumped. Thus, a pointing deviation is caused at the side opposite to the turned-off LD. Thus, as illustrated in FIG. 8, the LD 23 disposed on the side facing the failed LD 20 across the central axis 10 of the solid-state pumping medium. Consequently, as shown in FIG. 8, the unevenness of the pumping distribution on a line connecting the failed LD 20 to the center of the solid-state pumping medium is eliminated. The pointing deviation is mitigated. Because the LD 23 positioned at a place facing the failed LD 20, the number of turned-on LDs is (n−2). The pumping efficiency is $\beta_2$ ($\beta_1 > \beta_2 > \beta_3$). In a case where the laser output is adapted to follow the instruction value $P_{YAG1}$ (see a point D shown in FIG. 7), the following equations are derived from the equations (3) and (4).

$$\beta_2\{(n-2) \cdot P_{LD2}\} = P_{YAG1} \quad (6)$$
$$\beta_2\{(n-2) \cdot \alpha(I_2 - I_0)\} = \beta_1\{n \cdot \alpha(I_1 - I_0)\}$$
$$I_2 = \frac{n}{n-2} \cdot \frac{\beta_1}{\beta_2} \cdot (I_1 - I_0) + I_0$$

Incidentally, (the number of turned-on LDs)≫1. Thus, $$\frac{n}{n-2} \approx 1$$

The term $$\frac{\beta_1}{\beta_2}$$

of the value of $I_2$ is dominant. Thus, in a case where the LD energizing currents $I_2$ and $I_3$ are compared with each other, $I_3 > I_2$ according to the equations (5) and (6), because $\beta_2 > \beta_3$. It is obvious that the LD energizing current becomes smaller in a case where the LD facing the failed LD is turned off.

In the foregoing description, the enhancement of the pumping efficiency of the oscillator constituted by one cavity has been described. However, the improvement of the pumping efficiency in an oscillator, in which plural cavities are connected, is performed as follows. Before a failure of the LD occurs, the pumping efficiency of each of all the cavities is $\beta_1$. After the LD is faulty and is turned off, the pumping efficiency of the cavity including the failed LD is $\beta_3$. Even in the case of a cavity, in which all the LDs are normal, the pumping efficiency is substantially $\beta_3$. After the failure of the LD occurs, in a case where the LD facing the failed LD is turned off, the pumping efficiency of the cavity including the failed LD is $\beta_2$, while the pumping efficiency of the other cavities, in each of which all the LDs are normal, is substantially $\beta_1$.

In a case where the LD facing the failed LD is turned off, the unevenness of the pumping distribution with respect to the central axis 10 of the solid-state pumping medium in the cavity including the failed LD is substantially eliminated, so that the pointing deviation is corrected. However, slight unevenness of the pumping distribution still remains in the direction of length of the solid-state pumping medium (that is, the direction of the central axis 10 thereof). Thus, the pumping efficiency does not reach $\beta_1$ and is $\beta_2$. On the other hand, the pumping efficiency of the cavity, in which all the LDs are normal, almost reaches $\beta_1$, because the pointing deviation caused therein is corrected when the pointing deviation in the cavity including the failed LD is corrected.

Thus, the improvement of the pumping efficiency in the oscillator having a plurality of cavities is more noticeable.

Next, the aforementioned advantage is described below with an example of a practical oscillator by showing concrete numerical data. For example, the advantage is studied by using the aforementioned equations in the following LD/cavity model.

The Number of LDs: n=100.
The Direction Number: even
Threshold Current: $I_0$=10 A.
Energizing Current: I=40 A.
Pumping Efficiency: $\beta_1$=50%
Ratio of LD output to Energizing Current: $\alpha$=40 W/60 A.

In a case where all the LDs included in the cavity are normal, a cavity output is obtained from the equation (3) as follows.

$$P_{YAG1} = 0.5 \cdot 100 \cdot \frac{40\ [W]}{60\ [A]} (40\ [A] - 10\ [A]) = 1000\ [W]$$

Next, in a case where one LD is faulty and is turned off, an energizing current for LD, which is needed for maintaining the cavity output, is 42.42 A. That is, as compared with a normal case, the LD energizing current increases by 2.42 A (42.42 A−40 A=2.42 A). The pumping efficiency due to the pointing deviation at that time is obtained by using the equation (5) as follows.

$$I_3 = \frac{n}{n-1} \cdot \frac{\beta_1}{\beta_3} \cdot (I_1 - I_0) + I_0$$
$$= \frac{100}{99} \cdot \frac{0.5}{\beta_3} \cdot (40 - 10) + 10$$
$$= 42.42\ [A]$$
$$\beta_3 = 0.47$$

Next, in a case where the bypass circuit corresponding to the LD provided at the position facing the turned-off LD is operated to thereby turn off the former LD, the energizing current for the LD, which is needed for maintaining the cavity output, is 41.42 A.

That is, the energizing current for the LD is increased by 1.42 A (41.42 A−40 A=1.42 A), as compared with the ordinary case. On the other hand, as compared with a case where the LD facing the failed LD is not turned off, the energizing current for the LD is decreased by 1 A (41.42 A−42.42 A=−1 A). The pumping efficiency due to the pointing deviation at that time is obtained from the equation (6) as follows.

$$I_2 = \frac{n}{n-2} \cdot \frac{\beta_1}{\beta_2} \cdot (I_1 - I_0) + I_0$$
$$= \frac{100}{98} \cdot \frac{0.5}{\beta_2} \cdot (40 - 10) + 10$$
$$= 41.42\ [A]$$
$$\beta_2 = 0.49$$

Thus, it is found that as compared with the case where the LD facing the turned-off LD is not turned off, the pumping efficiency due to the pointing deviation is improved by 2% (0.47→0.49).

Also, it is known that the relation between the output (P) and the lifetime (T) of an LD is defined by the following equation (7).

$$T \propto \left(\frac{P_1}{p_0}\right)^{-2.7} \quad (7)$$

It is now assumed that the lifetime of an LD is 10000 Hr at an energizing current of 40 A for the LD. In a case where the LD placed symmetrically with the failed LD is not turned off, the current for the LD is increased from 40 A to 42.42 A. As is understood from the equation (1), the output of the LD is proportional to $(I-I_0)$. Thus, the lifetime of the LD is given as follows.

$$1000\ Hr \times \left(\frac{42.42\ A - 10\ A}{40\ A - 10\ A}\right)^{-2.7} = 8110\ Hr$$

On the other hand, in a case where the LD placed symmetrically with the failed LD is turned off, the current for the LD is increased from 40 A to 41.42 A. Thus, the lifetime of the LD is given as follows.

$$1000\ Hr \times \left(\frac{41.42\ A - 10\ A}{40\ A - 10\ A}\right)^{-2.7} = 8826\ Hr$$

Therefore, as compared with the case where the LD placed symmetrically with the failed LD is not turned off, the lifetime of the LD is lengthened by 716 Hr (8826 Hr−8110 Hr=716 Hr). Consequently, an advantage in increasing the lifetime by a ratio of about 9% is obtained.

Also, a result of the comparison in power consumption therebetween is as follows. In a case where the LD placed symmetrically with the failed LD is not turned off, the number of LDs is 99. The ON-voltage of the LD is 1.8V. The current for the LD is 42.42 A. Thus, the power consumption in this case is given by the following equation.

99×1.8×42.42=7527 W.

On the other hand, in a case where the LD placed symmetrically with the failed LD is turned off, the number of LDs is 98. The ON-voltage of the LD is 1.8V. The current for the LD is 41.42 A. Thus, the power consumption in this case is given by the following equation.

98×1.8×41.42=7257 W.

Thus, power of about 270 W is saved. Consequently, an advantage in reducing electric power by a ratio of about 4% is obtained.

As described above, the LD-pumped solid-state laser oscillator is provided with the detection circuit adapted to detect a failure of the LD, the bypass circuit adapted to bypass electric current flowing in the LD, the LD shortcircuit control unit adapted to control the bypass circuit according to a signal sent from the detection circuit and also adapted to shortcircuit a predetermined LD. Thus, even in a case where a failure of the LD occurs and where a reduction in the pumping efficiency is caused due to the pointing deviation in the solid-state pumping medium, the pointing deviation can be corrected and the pumping efficiency can be enhanced by causing the bypass circuit corresponding to the predetermined LD according to the position of the failed LD to operate and by turning off the predetermined LD. Consequently, an increase in power supplied to the LD, which is caused to obtain the original laser output, can be suppressed. Also, the lifetime of the LDs can be increased. Additionally, the power consumption of the LDs can be reduced.

Industrial Applicability

The LD-pumped solid-state laser oscillator according to the invention is especially suited to a laser oscillator, which needs to have many LDs serving as pumping light sources, and to a laser oscillator that needs to connect a plurality of cavities.

The invention claimed is:

1. A laser-diode-pumped solid-state laser oscillator comprising:
a solid-state pumping medium;
a plurality of laser diodes arranged around said solid-state pumping medium and configured to irradiate pumping light to said solid-state pumping medium;
a detector configured to detect a failure of a failed one of said laser diodes; and
a controller configured to determine a position of said failed laser diode, and to control supply currents to other normal laser diodes, according to the position of said failed laser diode,
wherein said controller is configured to stop supply of electric current to and turn off a part or all of normal laser diodes positioned on a same plane as the position of said failed laser diode, and
wherein said same plane is perpendicular to a central longitudinal axis of said solid-state pumping medium.

2. The laser-diode-pumped solid-state laser oscillator according to claim 1, wherein
said controller is configured to stop supply of electric current to and turn off a normal laser diode provided at a position facing the position of the failed laser diode in a case where a direction number of said laser diodes is even.

3. The laser-diode-pumped solid-state laser oscillator according to claim 1, wherein:
said controller is configured to stop supply of electric current to and turn off all of the normal laser diodes positioned on said same plane in a case where a direction number of said laser diodes is odd.

4. The laser-diode-pumped solid-state laser oscillator according to claim 1, wherein
said detector is provided between electrodes of said failed laser diode and is configured to detect the failure of said failed laser diode according to a voltage between said electrodes of said failed laser diode.

5. The laser-diode-pumped solid-state laser oscillator according to claim 1, wherein
said controller is configured to short-circuit between electrodes of said failed laser diode and to bypass electric current flowing to said failed laser diode by controlling a bypass circuit provided between said electrodes of said failed laser diode.

6. The laser-diode-pumped solid-state laser oscillator according to claim 1, further comprising an
adjuster configured to detect power of an outputted laser beam and to adjust an amount of electric power supplied to said normal laser diodes so as to obtain desired laser beam power.

7. The laser-diode-pumped solid-state laser oscillator according to claim 1, further comprising
a plurality of cavities, each of which comprises a solid-state pumping medium and a plurality of laser diodes,
wherein the plurality of cavities are arranged on a same optical axis of a laser beam to thereby obtain a laser output.

8. A method of controlling laser diodes of a laser-diode-pumped solid-state laser oscillator configured to pump a solid-state pumping medium by pumping light outputted from said laser diodes to obtain a laser output, the method comprising the operations of:
detecting a failure of a failed one of said laser diodes;
determining a position of said failed laser diode;
selecting a laser diode, which is to be turned off, according to the determined position;
turning off said selected laser diode; and
adjusting a laser output, which is changed by turning off said selected laser diode, to a desired laser output, wherein said operation of selecting said laser diode comprises selecting a part or all of normal laser diodes positioned on a same plane as the position of said failed laser diode, and wherein said same plane is perpendicular to a central longitudinal axis of said solid-state pumping medium.

9. The method of controlling laser diodes according to claim 8, wherein said operation of selecting said laser diode comprises selecting a normal laser diode provided at a position facing the position of said failed laser diode in a case where a direction number of said laser diodes is even.

10. The method of controlling laser diodes according to claim 8, wherein said operation of selecting said laser diode comprises stopping supply of electric current to and turning off all normal laser diodes positioned on a same plane as the position of said failed laser diode, and wherein said same plane is perpendicular to a central longitudinal axis of said solid-state pumping medium in a case where a direction number of said laser diodes is odd.

11. A laser-diode-pumped solid-state laser oscillator comprising:

a solid-state pumping medium;

a plurality of laser diodes arranged around said solid-state pumping medium and configured to irradiate pumping light to said solid-state pumping medium;

a detector configured to detect a failure of a failed one of said laser diodes; and a controller configured to determine a direction from which said failed laser diode irradiated pumping light to said solid-state pumping medium, and to control supply currents to other normal laser diodes, according to the determined direction, wherein said controller is configured to stop supply of electric current to and turn off a part or all of normal laser diodes positioned on a same plane as the direction from which said failed laser diode irradiated pumping light to said solid-state pumping medium, and wherein said same plane is perpendicular to a central longitudinal axis of said solid-state pumping medium.

* * * * *